United States Patent [19]

Watanabe et al.

[11] Patent Number: 5,449,705

[45] Date of Patent: Sep. 12, 1995

[54] SILICON-CONTAINING POLYAMIC ACID DERIVATIVE AND PHOTOSENSITIVE RESIN COMPOSITION USING IT

[75] Inventors: Eiji Watanabe; Kouichi Katou; Hirotoshi Maeda, all of Kanagawa; Kouichi Kunimune, Chiba, all of Japan

[73] Assignee: Chisso Corporation, Osaka, Japan

[21] Appl. No.: 229,741

[22] Filed: Apr. 19, 1994

[30] Foreign Application Priority Data

Apr. 20, 1993 [JP] Japan .................. 5-093292

[51] Int. Cl.$^6$ .................. G03F 7/075; C08G 73/10; C08G 77/06; C08L 77/06
[52] U.S. Cl. .................. 522/148; 522/164; 528/25; 528/26; 528/35; 430/270; 430/283; 430/906
[58] Field of Search .................. 522/148, 164; 528/25, 528/26, 35; 430/270, 283, 906

[56] References Cited

U.S. PATENT DOCUMENTS

| | | | |
|---|---|---|---|
| 3,893,811 | 7/1975 | Good et al. | 528/26 |
| 3,950,308 | 4/1976 | Greber et al. | 528/26 |
| 5,055,549 | 10/1991 | Maeda et al. | 528/310 |
| 5,071,908 | 12/1991 | Kunimune et al. | 528/41 |
| 5,187,241 | 2/1993 | Buchwalter et al. | 525/420 |

FOREIGN PATENT DOCUMENTS

| | | |
|---|---|---|
| 54-145794 | 11/1979 | Japan . |
| 2144539 | 6/1990 | Japan . |
| 3763 | 1/1991 | Japan . |
| 4120171 | 4/1992 | Japan . |

OTHER PUBLICATIONS

Buhr et al, "Non-Ionic Photoacid Generating Compounds", *Polymeric Materials: Science and Engineering*, vol. 61, pp. 269–277, 1989.

Primary Examiner—Susan W. Berman
Attorney, Agent, or Firm—Leydig, Voit & Mayer

[57] ABSTRACT

The present invention provides a silicon-containing polyamic acid derivative which is represented by the formula (VI)

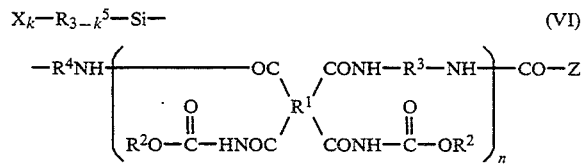

and which has a logarithmic viscosity number of 0.1 to 5.0 dl/g at 30° C. in N-methyl-2-pyrrolidone, said silicon-containing polyamic acid derivative being obtained by reacting A mol of a tetracarboxylic acid derivative, B mol of a diamine, and C mol of an aminosilicon compound so as to meet the relations of the equations (IV) and (V):

$$1 \leq \frac{C}{(A - B)} \leq 2.5 \quad \text{(IV)}$$

$$0.05 \leq \frac{C}{(B + C)} \leq 1 \quad \text{(V)}$$

A photosensitive resin composition using this silicon-containing polyamic acid derivative can be easily manufactured, permits the formation of a negative type sharp relief pattern, can inhibit film reduction at the time of curing by baking, and is excellent in adhesive properties to substrates, heat stability and shelf stability.

2 Claims, 1 Drawing Sheet

SILICON-CONTAINING POLYAMIC ACID DERIVATIVE AND PHOTOSENSITIVE RESIN COMPOSITION USING IT

BACKGROUND OF THE INVENTION (i) Field of the Invention

The present invention relates to a polyamic acid derivative and a photosensitive resin composition using it. More specifically, it relates to a polyamic acid derivative which is easily manufactured, inhibits volume shrinkage at the time of curing, and is excellent in adhesive properties to substrates, heat stability and shelf stability; and it also relates to a photosensitive resin composition using this derivative.

(ii) Description of the Related Art

As heat-resistant photosensitive materials, photosensitive polyimides have been widely used to form insulating films and passivation films for semiconductors. Most of the photosensitive polyimides are mixtures of compounds having carbon-carbon double bonds polymerizable by light irradiation and polyimide precursors, or obtained by a combination of the precursors with aforementioned unsaturated compound by such a chemical bond such as an ester. For example, these photosensitive polyimides are known from Japanese Patent Application Laid-open Nos. (Sho) 54-145794 and (Hei) 2-144539, and Japanese Patent Publication No. (Sho) 55-41422. However, in order to practically carry out a pattern treatment, it is necessary to introduce a large amount, e.g., 50% or more of a compound having a carbon-carbon double bond to the polyimide precursor, and therefore the deterioration of resolution and large volume shrinkage at the time of curing cannot be avoided. On the other hand, a method has also been suggested in which a compound capable of generating an acid by light irradiation is utilized without using the compound having the carbon-carbon double bond to avoid such a problem. For example, the compound capable of generating the acid by light irradiation is blended with a polyimide having an acyloxy group in Japanese Patent Application Laid-open No. (Hei) 3-763, or with a polyamic acid derivative including an organic group introduced by an ester bond in Japanese Patent Application Laid-open No. (Hei) 4-120171, whereby the pattern treatment can be carried out. In the former, however, the volume shrinkage can be controlled, but the adhesive properties to substrates are poor. In the latter, the resolution is excellent, but the preparation of the polyamic acid derivative is inconveniently intricate.

SUMMARY OF THE INVENTION

An object of the present invention is to provide a photosensitive resin composition which is easy to manufacture, provides good resolution, inhibits volume shrinkage, and has excellent adhesion to substrates.

We, the present inventors, have intensively researched to solve the above-mentioned problems of conventional techniques. As a result, we have found that the above-mentioned various problems can be solved by a photosensitive resin composition comprising, as essential components, a silicon-containing polyamic acid derivative obtained by reacting an aminosilicon compound having an alkoxy group and a compound capable of generating an acid by light irradiation, and in consequence, the present invention has now been completed.

A silicon-containing polyamic acid derivative of the present invention is represented by the formula (VI)

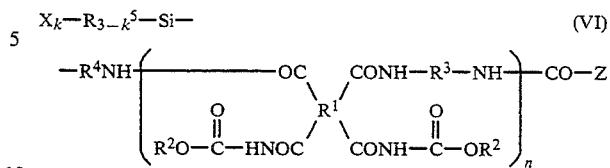

and has a logarithmic viscosity number of 0.1 to 5.0 dl/g at 30° C. in N-methyl-2-pyrrolidone, and this silicon-containing polyamic acid derivative can be obtained by reacting A mol of a tetracarboxylic acid derivative represented by the formula (I)

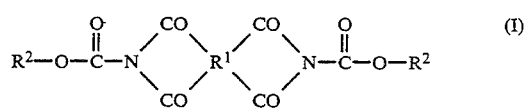

B mol of a diamine represented by the formula (II)

$$H_2N-R^3-NH_2 \quad (II)$$

and C mol of an aminosilicon compound represented by the formula (III)

$$H_2N-R^4-SiR_{3-k}^5-X_k \quad (III)$$

so as to meet the relations of the equations (IV) and (V)

$$1 \leq \frac{C}{(A-B)} \leq 2.5 \quad (IV)$$

$$0.05 \leq \frac{C}{(B+C)} \leq 1 \quad (V)$$

wherein $R^1$ is a tetravalent organic group; $R^2$ is independently an alkyl group having 1 to 6 carbon atoms, a phenyl group or an alkyl-substituted phenyl group having 7 to 12 carbon atoms; $R^3$ is an organic group having at least 2 carbon atoms or a polysiloxane group; $R^4$ is

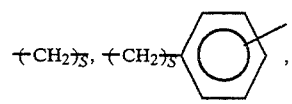

wherein s is an integer of 1 to 4; $R^5$ is independently an alkyl group having 1 to 6 carbon atoms, a phenyl group or an alkyl-substituted phenyl group having 7 to 12 carbon atoms; X is a hydrolyzable alkoxy group; and Z is

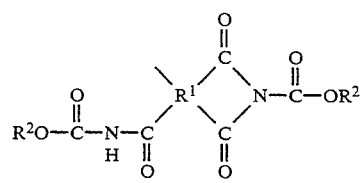

-continued or

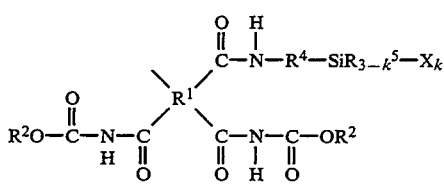

wherein k is a value of $1 \leq k \leq 3$ and $n \geq 0$.

A photosensitive resin composition of the present invention is characterized by comprising (1) the above-mentioned silicon-containing polyamic acid derivative and (2) a compound capable of generating an acid by light irradiation.

DETAILED DESCRIPTION OF PREFERRED EMBODIMENTS

Figure 1:
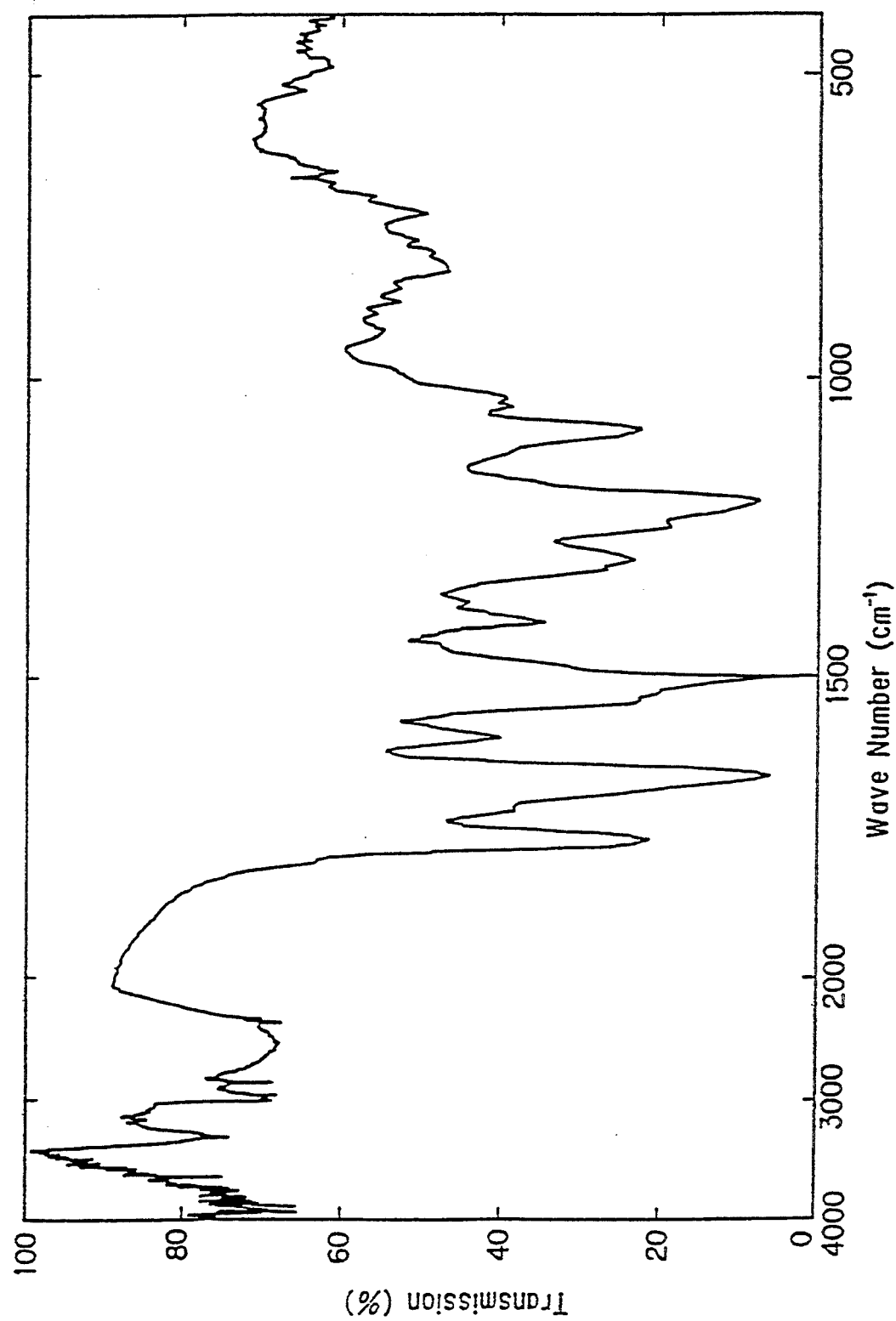
FIG. 1 is an infrared absorption spectrum of a silicon-containing polyamic acid derivative.

A silicon-containing polyamic acid derivative of the present invention can be obtained by reacting a tetracarboxylic acid derivative, a diamine and an aminosilicon compound in a polar solvent in a known manner.

In order to obtain the silicon-containing polyamic acid derivative of the present invention, a tetracarboxylic acid derivative represented by the aforesaid formula (I), a diamine represented by the aforesaid formula (II) and an aminosilicon compound represented by the aforesaid formula (III) are reacted at a temperature of 0° to 100° C., preferably 20° to 60° C. so as to meet the relations of the aforesaid equations (IV) and (V). If a value of C/(A−B) in the formula (IV) is less than 1 or more than 2.5, the viscosity of the obtained silicon-containing polyamic acid derivative represented by the formula (VI) noticeably changes with time, and so its shelf stability is poor. If a value of C/(C+B) in the equation (V) is less than 0.05, sufficient sensitivity cannot be obtained.

From the viewpoint of film formation, this silicon-containing polyamic acid derivative suitably has a logarithmic viscosity number in the range of 0.1 to 5 dl/g. Here, the logarithmic viscosity number can be defined as $\eta_{inh}$ represented by the equation (VII)

$$\eta_{inh} = \frac{l_n \eta/\eta_0}{C} \quad \text{(VII)}$$

wherein $\eta$ and $\eta_0$ are a viscosity of a solution and a viscosity of a solvent, respectively, measured at a temperature of 30±0.01° C. by the use of a Ubbelohde's viscometer; and C is a concentration of the solution, i.e., 0.5 g/dl.

Detailed reference will be made to (a) the tetracarboxylic acid derivative, (b) the diamine and (c) the aminosilicon compound which are the reactive components for obtaining the silicon-containing polyamic acid derivative of the present invention, and (d) the polar solvent as a reaction solvent for them.

The tetracarboxylic acid derivative (a) which can be used to obtain the silicon-containing polyamic acid derivative of the present invention can be easily produced by a known synthetic process, for example, a process described in Industrial Chemical Journal, .69, p. 253 (1966). That is, in the first place, a tetracarboxylic dianhydride is reacted with ammonium carbonate, and the resulting powdery imide compound is then dispersed in a solvent such as acetone and/or triethylamine. Next, a chloroformate is slowly added thereto at 8° C. or less with stirring, and stirring is then continued for 3 to 8 hours, thereby obtaining the tetracarboxylic acid derivative:

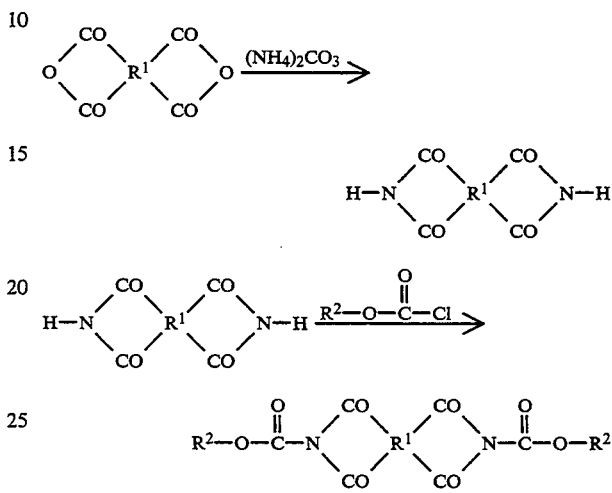

Typical examples of the tetracarboxylic dianhydride among the above-mentioned reaction raw materials include the following known compounds, but they are not always limited to these compounds:

Aromatic tetracarboxylic dianhydrides such as pyromellitic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 3,3',4,4'-benzophenonetetracarboxylic dianhydride, 2,2',3,3'-benzophenonetetracarboxylic dianhydride, 2,3,3',4'-benzophenonetetracarboxylic dianhydride, bis-(3,4-dicarboxyphenyl) ether dianhydride, bis-(3,4-dicarboxyphenyl)sulfone dianhydride, 1,2,5,6-naphthalenetetracarboxylic dianhydride, 2,3,6,7-naphthalenetetracarboxylic dianhydride, 2,2-bis-(3,4-dicarboxyphenyl)hexafluoropropane dianhydride and the like; alicyclic tetracarboxylic dianhydrides such as cyclobutanetetracarboxylic dianhydride, methylcyclobutanetetracarboxylic dianhydride and the like; and aliphatic tetracarboxylic dianhydrides such as 1,2,3,4-tetracarboxybutane dianhydride and the like.

Furthermore, typical examples of the chloroformate which is the other raw material include the following compounds, but they are not always limited to these compounds:

Allyl chloroformate, n-amyl chloroformate, benzyl chloroformate, n-butyl chloroformate, iso-butyl chloroformate, ethyl chloroformate, n-hexyl chloroformate, isobutyl chloroformate, 2-methoxyethyl chloroformate, methyl chloroformate, phenyl chloroformate, n-propyl chloroformate, iso-propyl chloroformate and p-toluene chloroformate.

Typical examples of the diamine (b) include the following compounds, but they are not always limited to these compounds:

Aromatic diamines such as 4,4'-diaminodiphenyl ether, 3,4'-diaminodiphenyl ether, 4,4'-diaminodiphenylmethane, 4,4'-diaminodiphenyl sulfone, 4,4'-diaminodiphenyl sulfide, 4,4'-di(m-aminophenoxy)- diphenyl sulfone, 4,4'-di(p-aminophenoxy)diphenyl sulfone, orthophenylenediamine, methaphenylenediamine, p-phenylenediamine, benzidine, 3,3'-diaminobenzophenone, 4,4'-diaminobenzophenone, 4,4'-diaminodiphenyl-2,2-propane, 1,5-diaminonaphthalene, 1,8-diaminonaphthalene, 4,4'-bis(4-aminophenoxy)biphenyl, 2,2-bis{4-(4-aminophenoxy)phenyl}propane, 2,2-bis{4-(4-aminophenoxy)phenyl}hexafluoropropane, 1,4-bis(4-aminophenoxy)benzene, 1,3-bis(4-aminophenoxy)benzene, 4,4'-diamino-3,3'-diethyl-5,5'-dimethyldiphenylmethane, 4,4'-diamino-3,3',5,5'-tetramethyldiphenylmethane, 1,4-diaminotoluene, methaxylylenediamine, 2,2'-dimethylbenzidine and the like; aliphatic diamines such as trimethylenediamine, tetramethylenediamine, hexamethylenediamine, 2,11-dodecanediamine and the like; silicon-based diamines such as bis(p-aminophenoxy)dimethylsilane, 1,4-bis(3-aminopropyldimethylsilyl)benzene and the like; alicyclic diamines such as 1,4-diaminocyclohexane, bis(4-aminocyclohexyl)methane, isophoronediamine and the like; and guanamines such as acetoguanamine, benzoguanamine and the like.

As the diamine, a diaminopolysiloxane can be used, and its examples include compounds represented by the following formulae wherein p is in the range of from 1 to 100:

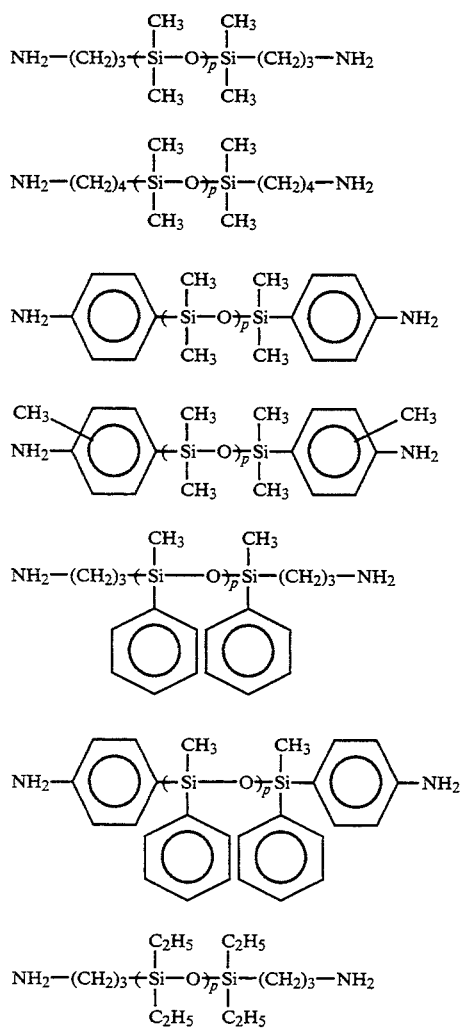

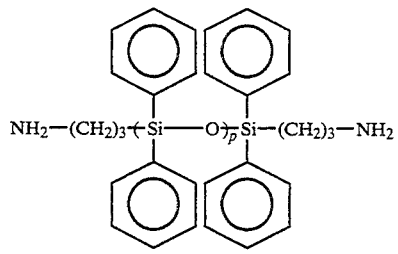

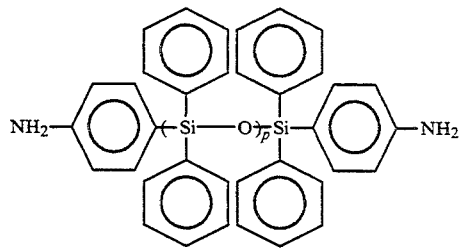

Known diamines other than mentioned above can be also widely used.

Typical examples of the aminosilicon compound (c) include the following compounds, but they are not always limited to these compounds:

Aminomethyl-di-n-propoxy-methylsilane, ($\beta$-aminoethyl)-di-n-propoxy-methylsilane, ($\beta$-aminoethyl)-diethoxy-phenylsilane, ($\beta$-aminoethyl)-tri-n-propoxysilane, ($\beta$-aminoethyl)-dimethoxy-methylsilane, ($\gamma$-aminopropyl)-di-n-propoxy-methylsilane, ($\gamma$-aminopropyl)-di-n-butoxymethylsilane, ($\gamma$-aminopropyl)-trimethoxysilane, ($\gamma$-aminopropyl)-triethoxysilane, ($\gamma$-aminopropyl)-di-n-pentoxyphenylsilane, ($\gamma$-aminopropyl)-methoxy-n-propoxymethylsilane, ($\delta$-aminobutyl)-dimethoxy-methylsilane, (3-aminophenyl)-di-n-propoxy-methylsilane, (4-aminophenyl)-tri-n-propoxysilane, [$\beta$-(4-aminophenyl)-ethyl]-diethoxy-methylsilane, [$\beta$-(3-aminophenyl)-ethyl]-di-n-propoxy-methylsilane, [$\gamma$-(4-aminophenyl)propyl]-di-n-propoxy-methylsilane, [$\gamma$-(4-aminophenoxy)propyl]-di-n-propoxy-methylsilane, [$\gamma$-(3-aminophenoxy)-propyl]-di-n-butoxy-methylsilane, ($\gamma$-aminopropyl)-methyl-dimethoxysilane, ($\gamma$-amino-propyl)-methyl-diethoxysilane, ($\gamma$-aminopropyl)-ethyl-di-n-propoxysilane, 4-aminophenyl-trimethoxysilane, 3-amino-phenyl-trimethoxysilane, 4-aminophenyl-methyl-dimethoxysilane, 3-aminophenyl-dimethyl-methoxysilane and 4-aminophenyl-triethoxysilane.

Preferable typical examples of the solvent (d) in which the above-mentioned reaction components (a), (b) and (c) can be reacted include N-methyl-2-pyrrolidone, N,N-dimethylacetamide, N,N-dimethylformamide, dimethyl sulfoxide, tetramethylurea, pyridine, hexamethylphosphoramide, methylformamide, N-acetyl-2-pyrrolidone, 2-methoxyethanol, 2-ethoxybutanol, 2-butoxyethanol, diethylene glycol monomethyl ether, diethylene glycol monoethyl ether, diethylene glycol monobutyl ether, cyclopentanone, cresol, $\gamma$-butyrolactone, isophorone, N,N-diethylacetamide, N,N-diethylformamide, N,N-dimethylmethoxyacetamide, tetrahydrofuran, N-methyl-$\epsilon$-caprolactam and tetrahydrothiophene dioxide (sulpholane).

Furthermore, the above-mentioned polar solvent, when used, may be diluted with another non-protonic (neutral) organic solvent such as an aromatic, an alicyclic or an aliphatic hydrocarbon, its chlorinated derivative (e.g., benzene, toluene, xylene, cyclohexane, pentane, hexane, petroleum ether, methylene chloride or the like), an alcohol, dioxane or the like.

The photosensitive resin composition of the present invention can be obtained by blending the silicon-containing polyamic acid derivative produced by the above process with a compound capable of generating an acid by light irradiation.

The amount of the compound capable of generating an acid by light irradiation is in the range of 0.01 to 30 parts by weight, preferably 0.5 to 15 parts by weight based on 100 parts by weight of the silicon-containing polyamic acid derivative. If this amount is less than 0.01 part by weight, sensitivity is low, and if it is more than 30 parts by weight, the film quality of a cured polyimide deteriorates.

Furthermore, if necessary, additives such as a sensitizing agent, a dye, a pigment and a surface active agent and the like can be added to the photosensitive resin composition.

Examples of the compound capable of generating an acid by light irradiation which can be used in the photosensitive resin composition of the present invention include many known compounds and mixtures thereof. Detailed examples include various onium salts such as ammonium salts, diazonium salts, iodonium salts, sulfonium salts, selenium salts, arsonium salts and the like; organic halogen compounds such as phenyltrihalomethylsulfone compounds, halomethyltriazine compounds, halomethyloxadiazole compounds and the like; esters and amide compounds of 1,2-naphthoquinonediazido-(2)-4-sulfonic acid, sulfonate compounds of nitrobenzyl alcohol, sulfonate compounds of oximes, sulfonate compounds of N-hydroxyamides and N-hydroxyimides, $\beta$-ketosulfone-based compounds, sulfonate compounds of benzoin, and the like.

Typical examples include the following compounds, but they are not restrictive:

Di(p-t-butylphenyl)diphenyliodonium trifluoromethanesulfonate, diphenyliodonium tetrafluoroborate, diphenyliodonium hexafluorophosphate, diphenyliodonium trifluoromethanesulfonate, benzenediazonium paratoluenesulfonate, 4-p-tolyl-mercapto-2,5-diethoxybenzenediazonium hexafluorophosphate, diphenylamine-4-diazonium sulfate, tri(t-butylphenyl)sulfonium trifluoromethanesulfonate, triphenylsulfonium trifluoromethanesulfonate, triphenylselenium tetrafluoroborate, orthonitrobenzyl p-toluenesulfonate, benzoin tosylate, benzoin methanesulfonate, benzoin trifluoromethanesulfonate, benzoin-2-trifluoromethane benzenesulfonate, anisoin tosylate, anisoin methanesulfonate, anisoin trifluoromethanesulfonate, anisoin-2-trifluoromethane benzenesulfonate, 1-benzoyl-1-methylsulfonyloxy-cyclohexane, 2-[(p-tolylsulfonyl)oxy]-1-phenyl-1-octanone, 2-[($\beta$-naphthylsulfonyl)oxy]-1-phenyl-1-propanone, 2-[(p-acetamidophenylsulfonyl)oxy]-1-phenyl-1-propanone, benzoic acid amide tosylate, benzoic acid amide methanesulfonate, N-[(methanesulfonyl)oxy]phthalimide, N-tosyloxyphthalimide, N-[(2-trifluoromethanebenzenesulfonyl)oxy]phthalimide, N-[(methanesulfonyl)oxy]-1,8-naphthalimide, N-tosyloxy-1,8-naphthalimide, N-[(2-trifluoromethanebenzenesulfonyl)oxy]-1,8-naphthalimide, N-[(methanesulfonyl)oxy]-2,3-diphenylmaleimide, N-tosyloxy-2,3-diphenylmaleimide, N-[(2-trifluoromethanebenzenesulfonyl)oxy]-2,3-diphenylmaleimide, 4-(di-n-propylamino)-benzonium tetrafluoroborate, 4-methyl-6-trichloromethyl-2-pyrone, 4-(3,4,5-trimethoxy-styryl)-6-trichoromethyl-2-pyrone, 4-(4-methoxy-styryl)-6-(3,3,3-trichloropropenyl)-2-pyrone, 2-trichloromethyl-benzimidazole, 2-tribromomethyl-quinone, 2,4-dimethyl1-tribromoacetyl-benzene, 4-dibromoacetylbenzoic acid, 1,4-bis-dibromomethyl-benzene, tris-dibromomethyl-s-triazine, 2-(6-methoxy-naphthyl-2-yl)-4,6-bis-trichloromethyl-s-triazine, 2-(naphthyl1-yl)-4,6-bis-trichloromethyl-s-triazine, 2-(naphthyl-2-yl)-4,6-bis-trichloromethyl-s-triazine, 2-(4-ethoxy-naphthyl1-yl)4,6-bis-trichloromethyl-s-triazine, 2-(benzopyranyl-3-yl)-4,6-bis-trichloromethyl-s-triazine, 2-(4-methoxy-anthracen-1-yl)-4,6-bis-trichloromethyl-s-triazine, 2-(-phenethyl-9-yl)-4,6-bis-trichloromethyl-s-triazine, o-naphthoquinone diazido-5-sulfonate, 2-phenyl-5-trichloromethyloxadiazole, 2-(p-methoxyphenyl)-5-trichloromethyloxadiazole, 2-styryl-5-trichloromethyloxadiazole, 2-(n-butyl)-5-trichloromethyloxadiazole, $\alpha$-trifluoroacetophenoneoxime-4-hydroxy benzenesulfonate, 9-(4-hydroxybenzenesulfonyloxyimino)-fluorene, 9-(4-methacrylamidomethylbenzenesulfonyloxyimino)-fluorene and the like.

The photosensitive resin composition of the present invention is usually supplied in the state of a solution. The photosensitive resin composition is applied onto a substrate, and a solvent is then removed. Afterward, light irradiation is done to generate an acid, and the thus generated acid functions as a catalyst, so that condensation proceeds between the alkoxy groups of an aminosilicon compound introduced into a silicon-containing polyamic acid derivative. As a result, the portion which has been irradiated with the light becomes insoluble in such an organic solvent as mentioned by way of an example of the reaction solvent or in an aqueous alkali solution, and by the utilization of this fact, a relief pattern of the silicon-containing polyamic acid derivative can be formed. The thus obtained patterned silicon-containing polyamic acid derivative is then heated to remove a carbamoyl compound, whereby imidization and the condensation between the alkoxy groups proceed to cure the silicon-containing polyamic acid derivative. Since an aminosilane compound which contributes to the adhesion of the photosensitive compound to the substrate is introduced into the polymer, the cured polymer is excellent in adhesive properties to the substrate. Therefore, it is unnecessary to treat the substrate with a coupling agent or the like. In addition, since photosensitivity can be given only by blending a small amount of the compound capable of generating the acid by light, the volume shrinkage of the polymer at the time of curing can be minimized.

Next, reference will be made to a process for forming a patterned silicon-containing polyamic acid derivative and silicon-containing polyimide by the use of the photosensitive resin composition of the present invention.

The photosensitive resin composition of the present invention can be applied to a substrate such as a silicon wafer, a metallic plate, a plastic plate, a glass plate or the like in a known manner such as spin coating, immersion, printing, dispensing, roll coating or the like. The formed coating film is pre-baked at a temperature of 30° to 150° C., preferably 60° to 120° C. for a period of several minutes to several tens of minutes by the use of a heating means such as an electric furnace, a hot plate or the like to remove most of the solvent in the coating film therefrom.

This coating film is then irradiated with actinic radiation through a negative mask. Examples of the actinic radiation include X-rays, electron rays, ultraviolet rays and visible light, and above all, the ultraviolet rays and the electron rays are desirable. Successively, if necessary, heating is given at 30° to 200° C., preferably 60° to 180° C. for 30 seconds to 15 minutes by the above-mentioned heating means, whereby curing due to condensation are accelerated by an acid generated by the light irradiation.

Next, an unirradiated portion is dissolved in a developing solution and removed to obtain a relief pattern. Examples of the developing solution which can be used herein include organic solvents enumerated above as the examples of the solvent for the reaction, and mixtures of these solvents and poor solvents such as an alcohol, xylene, water and the like. In addition to the above-mentioned organic solvents, other examples of the developing solution include aqueous solutions of inorganic alkalis such as sodium hydroxide, potassium hydroxide, sodium carbonate, sodium silicate, sodium metasilicate, ammonia and the like, aqueous solutions of organic amines such as ethylamine, n-propylamine, diethylamine, di-n-propylamine, triethylamine, methyldiethylamine, tetramethylammonium hydroxide, trimethylhydroxyethylammoinum hydroxide and the like. In certain cases, solutions formed by mixing these aqueous solutions with alcohols can also be used. If necessary, the coating film is then rinsed in a poor solvent such as an alcohol, water or the like, and then dried at a temperature of 150° C. or less. Alternatively, at any point of time after the pre-baking step, the film can be peeled from the substrate, and then used as the single film.

The silicon-containing polyamic acid derivative of the relief pattern formed by the development is in the state of the precursor of the polyimide. Thus, this is heated at a temperature of 200° to 500° C., preferably 300 to 400° C. for a period of several minutes to several tens of minutes by the above-mentioned heating means, whereby the portion of the polyamic acid derivative is removed as a carbamoyl compound to close a ring and to thereby be imidized. In the portion of the aminosilicon compound, the condensation of the alkoxy groups proceeds, thereby forming a patterned silicon-containing polyimide film.

In accordance with such a procedure, the patterned heat-resistant silicon-containing polyimide film can be obtained from the photosensitive resin composition of the present invention. The photosensitive resin composition of the present invention can be applied to electronic materials, particularly, various kinds of protective films, flattened films, passivation films and buffer coating films for semiconductor elements, α-ray breaking films for LSI memories, interlayer dielectrics films, interlayer films of multi-layer boards for printed-wiring boards, aligning films for liquid crystals, heat storage materials for thermal heads, and the like.

A silicon-containing polyamic acid derivative and a photosensitive resin composition using the same in the present invention can be easily manufactured by a process described in this specification, can provide a negative type sharp relief pattern, can inhibit film reduction at the time of curing by baking, and is also excellent in adhesive properties to a substrate, heat stability and shelf stability.

EXAMPLES

Next, the present invention will be described in detail in reference to examples, but the scope of the present invention should not be limited by these examples at all.

Example 1

(Synthesis of silicon-containing polyamic acid derivative)

A one-liter flask equipped with a stirrer, a dropping funnel, a thermometer, a condenser and a nitrogen-replacing device were fixed in a thermostatic chamber. Afterward, 500 g of dehydrated and purified N-methyl-2-pyrrolidone (hereinafter abbreviated to "NMP"), 32.69 g (0.1633 mol) of 4,4'-diamino diphenyl ether (hereinafter abbreviated to "DDE") and 13.93 g (0.0653 mol) of 4-aminophenyl-trimethoxysilane (hereinafter abbreviated to "APMS") were thrown into the flask, and they were then continuously stirred to dissolve them. To the resulting solution was added 90.97 g (0.1959 mol) of N,N'-bis-(ethoxycarbonyl)-3,3',4,4'-benzophenonetetracarboxdiimide (hereinafter abbreviated to "ECBTDI"), and reaction was then carried out at 40° to 50° C. for 8 hours to obtain a silicon-containing polyamic acid derivative having a concentration of 21.6% by weight in which 4-aminophenyl-tri-methoxysilane was added to terminals. FIG. 1 is an IR spectrum of the thus obtained silicon-containing polyamic acid derivative. Furthermore, Table 1 shows a logarithmic viscosity number of the obtained silicon-containing polyamic acid derivative.

Examples 2 to 8

(Synthesis of silicon-containing polyamic acid derivative)

The same apparatus, solvent and procedure as in Example 1 were used except that raw materials and concentrations shown in Table 1 were employed, to synthesize various silicon-containing polyamic acid derivatives. Table 1 shows values of C/(A−B) and C/(B+C) wherein A, B and C are mols of tetracarboxylic acid derivatives, diamines and aminosilicon compounds, respectively, and logarithmic viscosity numbers of the silicon-containing polyamic acid derivatives.

TABLE 1

| | Reaction Components | | |
|---|---|---|---|
| | Tetracarboxylic Acid Derivative | Diamine | Aminosilicon Compound |
| Example | g (A mol) | g (B mol) | g (C mol) |
| 1 | ECBTDI 90.97 (0.1959) | DDE 32.69 (0.1633) | APMS 13.93 (0.0653) |
| 2 | ECPMDI 98.43 (0.2732) | DDE 41.03 (0.2049) | APPS 24.37 (0.0820) |
| 3 | PCBPDI 48.95 (0.1054) | BAPP 40.39 (0.0984) | APMS 3.30 (0.0154) |
| 4 | PhCDSDI 66.99 (0.1123) | BAPS 38.84 (0.0898) | APES 9.17 (0.036) |
| 5 | MCODPI 63.77 (0.1503) | DDS 32.66 (0.1315) | APPS 8.94 (0.0301) |
| 6 | EC6FDI 76.81 (0.1310) | PDA 13.28 (0.1228) | APS-E 3.26 (0.0148) |
| 7 | TCBTDI 164.8 (0.2801) | APDS 60.91 (0.2451) | APS-E 15.49 (0.070) |
| 8 | MCODPI 55.03 (0.1297) | DDS 31.15 (0.1254) | APPS 2.05 (0.00692) |

Silicon-Containing
Polyamic Acid Derivative

TABLE 1-continued

| Example | Relation of A, B and C C/(A − B) | C/(B + C) | Concentration (Wt %) | Logarithmic Viscosity Number (dl/g) |
|---|---|---|---|---|
| 1 | 2.0 | 0.286 | 21.6 | 0.41 |
| 2 | 1.2 | 0.286 | 24.7 | 0.64 |
| 3 | 2.2 | 0.136 | 15.6 | 0.35 |
| 4 | 1.6 | 0.286 | 18.7 | 0.57 |
| 5 | 1.6 | 0.186 | 17.4 | 0.53 |
| 6 | 1.8 | 0.107 | 15.7 | 0.71 |
| 7 | 2.0 | 0.222 | 32.5 | 0.33 |
| 8 | 1.6 | 0.052 | 15.0 | 0.86 |

Meanings of the abbreviations used in Table 1 are as follows:

ECPMDI: N,N'-bis(ethoxycarbonyl)pyromellitidimide
PCBPDI: N,N'-bis(propoxycarbonyl)-3,3',4,4'-biphenyltetracarboxidimide
PhCDSDI: N,N'-bis(phenoxycarbonyl)-bis(3,4-dicarboxyphenyl)sulfondiimide
MCODPI: N,N'-bis(methoxycarbonyl)-bis(3,4-dicaroxyphenyl) ether diimide
EC6FDI: N,N'-bis(ethoxycarbonyl)-2,2-bis(3,4-dicarboxyphenyl)hexafluoropropanediimide
TCBTDI: N,N'-bis(m-methylphenoxycarbonyl)-benzophenonetetracarboxdiimide
BAPP: 2,2-bis{4-(4-aminophenoxy)phenyl}propane
BAPS: 4,4'-di(p-aminophenoxy)diphenylsulfone
DDS: 3,3'-diaminodiphenylsulfone
PDA: Paraphenylenediamine
APDS: Bis-(3-aminopropyl)tetramethyldisiloxane
APMS: 4-aminophenyl-tri-methoxysilane
APPS: 4-aminophenyl-tri-n-propoxysilane
APES: 4-aminophenyl-tri-ethoxysilane
APS-E: (γ-aminopropyl)-tri-ethoxysilane

Examples 9 to 16

(Photosensitive resin composition)

A compound capable of generating an acid by light irradiation (hereinafter referred to as "photoacid generator") was added to 10 G of each solution of silicon-containing polyamic acid derivatives synthesized in Examples 1 to 8, the amount of the light irradiation acid generator being such as to be 7 parts by weight with respect to 100 parts by weight of the silicon-containing polyamic acid derivative, to prepare photosensitive resin compositions.

Each of these photosensitive resin compositions was spin-coated onto a silicon wafer, and then dried on a hot plate at 90° C. for 3 minutes. In this case, the spining speed at the time of the application was adjusted so that the thickness of the dried film might be about 3 μm. Next, the coating film was exposed through a negative mask having a pattern for 10×10 μm perforations by a very high-pressure mercury lamp (9 mW/cm²). After the exposure, the film was heated for 2 minutes on a hot plate at 120° C., developed with a mixed solution of 70 parts by weight of NMP and 30 parts by weight of isopropyl alcohol, rinsed with water, and then dried. As a result, in every example, a 10×10 μm sharp pattern could be obtained. This was baked at 150° C. for 30 minutes and successively at 400° C. for 60 minutes. Every pattern could be prevented from collapsing. Table 2 shows kinds of photoacid Generator and irradiation doses used in the respective examples.

TABLE 2

Photosensitive

| | Resin Composition | | |
|---|---|---|---|
| Example | Polyamic Acid Derivative Solution (g) | Light Irradiation Acid Generator (g) | Exposure Conditions Exposure (mJ/cm²) |
| 9 | Example 1  10 | PA-1  0.151 | 200 |
| 10 | Example 2  10 | PA-1  0.173 | 150 |
| 11 | Example 3  10 | PA-2  0.109 | 400 |
| 12 | Example 4  10 | PA-3  0.131 | 150 |
| 13 | Example 5  10 | PA-4  0.122 | 300 |
| 14 | Example 6  10 | PA-5  0.110 | 350 |
| 15 | Example 7  10 | PA-6  0.228 | 400 |
| 16 | Example 8  10 | PA-4  0.105 | 500 |
| Comp. Ex. 2 | Comp. Ex. 2  10 | | 1500 |
| Comp. Ex. 3 | Comp. Ex. 3 (polyamic acid) 10 | PA-1  0.126 | 150 |
| Comp. Ex. 4 | Comp. Ex. 4 (polyamic acid) 10 | PA-1  0.126 | 200 |

| | Patterned Polyimide Film | | |
|---|---|---|---|
| Example | Film Thickness Change (%) | Adhesive Properties Test (Number of Peeled Pieces) | Shelf Stability (6 months) |
| 9 | 21 | 0 | Not changed |
| 10 | 28 | 0 | Not changed |
| 11 | 19 | 0 | Not changed |
| 12 | 23 | 0 | Not changed |
| 13 | 20 | 0 | Not changed |
| 14 | 19 | 0 | Not changed |
| 15 | 26 | 0 | Not changed |
| 16 | 22 | 0 | Not changed |
| Comp. Ex. 2 | 45 | 100 | Gelled |
| Comp. Ex. 3 | 20 | 0 | Gelled |
| Comp. Ex. 4 | 20 | 0 | Gelled |

The abbreviations of the light irradiation acid generators shown in Table 2 have the following meanings:

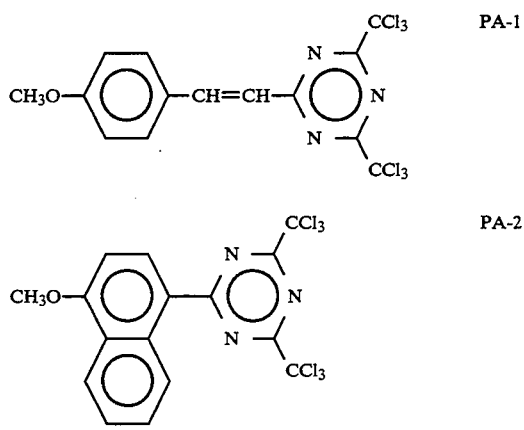

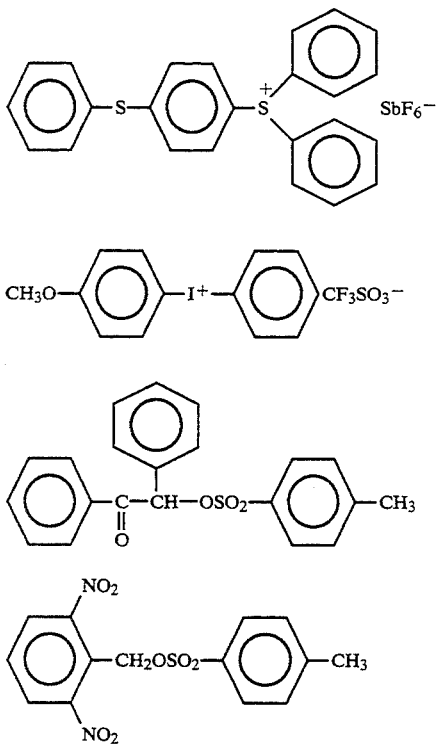

In order to confirm a magnitude of a film thickness change attributed to the volume shrinkage of the film at the time of the curing by the heating, the thickness of the film after the final baking was subtracted from that of the film after the development of the exposed portion in each example, and an obtained value was then divided by the film thickness after the development and an answer was expressed in percent. The results are shown in Table 2.

Furthermore, in order to confirm adhesion to a substrate, a cured film was formed on a silicon wafer in the same manner as in the above-mentioned example except that no mask was used, and this cured film was then cut so as to be sectioned into 100 small areas of a 2×2 mm square. Afterward, a cellophane tape was stuck on the surface of the cut film and then immediately peeled therefrom. The number of the sectioned areas from which the film had been peeled was counted to evaluate the adhesive properties. The results are shown in Table 2.

In addition, shelf stability was evaluated as the change of viscosity by allowing the solution to stand at 40° C. for 6 months, and as a result, the viscosity change was scarcely observed.

Comparative Example 1

The same apparatus and procedure as in Example 1 were used except that 500 g of NMP, 60.60 g (0.1305 mol) of ECBTDI and 26.13 g (0.1305 mol) of DDE were employed, to synthesize a polyamic acid derivative. This polyamic acid derivative solution was then applied to a silicon wafer in the same manner as in the example, and patterning was then tried in a like manner. As a developing solution, there was used a mixed solution of 70 parts by weight of NMP and 30 parts by weight of isopropyl alcohol. As a result, no pattern was not obtained even by irradiation with light of 5000 mJ/cm².

Comparative Example 2

A solution synthesized in Comparative Example 1 was sampled as much as 10 g, and 0.96 g of dimethylaminoethyl methacrylate and 0.05 g of Michler's ketone were added to 10 g of this sampled solution and they were then dissolved. For the thus formed solution, a change of film thickness and adhesive properties were evaluated in the same manner as in the example. As a developing solution, there was used a mixed solution of 70 parts by weight of NMP and 30 parts by weight of isopropyl alcohol. An irradiation dose and evaluation results are shown in Table 2.

Comparative Example 3

By the use of the same apparatus and in accordance with the same procedure as in Example 1, 500 g of NMP, 32.69 g (0.1633 mol) of DDE and 13.93 g (0.0653 mol) of APMS were added, and stirring was then continued to dissolve them. To the resulting solution was added 63.13 g (0.1959 mol) of 3,4,3′,4′-benzophenonetetracarboxylic dianhydride, and reaction was then carried out at 20 to 30° C. for 8 hours to obtain a silicon-containing polyamic acid having a concentration of 18.0% by weight in which APMS was added to terminals. Next, a light irradiation acid generator used in Example 9 was added to this polyamic acid solution, and the solution was then applied onto a silicon wafer in the same manner as in the example and patterning was similarly tried. As a developing solution, there was used a mixed solution of 70 parts by weight of NMP and 30 parts by weight of isopropyl alcohol. As a result, the solubility of an unexposed portion noticeably deteriorated, but a 10×10 μm sharp pattern could be obtained. The results are shown in Table 2.

Comparative Example 4

A light irradiation acid generator used in Example 9 was added to a solution synthesized in Comparative Example 3, and the solution was then applied onto a silicon wafer in the same manner as in the example. Next, the wafer was dried at 70° C. for 3 minutes on a hot plate, and by exposure, development was then carried out by heating on a hot plate at 70° C. for 2 minutes, whereby a 10×10 μm sharp pattern could be obtained without such deterioration of the solubility of an unexposed portion as in Comparative Example 3. The results are shown in Table 2.

Comparative Example 5

For solutions in Comparative Examples 2, 3 and 4, shelf stability was evaluated in the same manner as in Examples 9 to 16. The results are shown in Table 2. A photosensitive resin composition using a silicon-containing polyamic acid derivative of the present invention did not gel after 6 months, but in the solutions of Comparative Examples 2 and 3, viscosity increased, and after 6 months, gelation was confirmed. As compared with the comparative examples, it is apparent that the photosensitive resin composition of the present invention has a less film thickness change and is excellent in adhesive properties to a substrate, heat stability and shelf stability.

What is claimed is:

1. A silicon-containing polyamic acid derivative which is represented by the formula (VI)

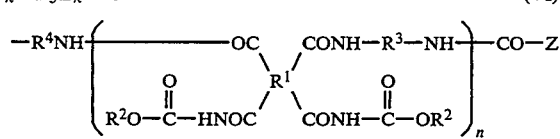

(VI)

and which has a logarithmic viscosity number of 0.1 to 5.0 dl/g at 30° C. in N-methyl-2-pyrrolidone, said silicon-containing polyamic acid derivative being obtained by reacting A mol of a tetracarboxylic acid derivative represented by the formula (I)

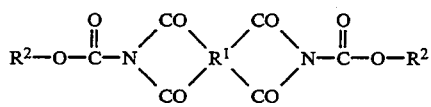

(I)

B mol of a diamine represented by the formula (II)

$$H_2N-R^3-NH_2 \quad (II)$$

and C mol of an aminosilicon compound represented by the formula (III)

$$H_2N-R^4-SiR_{3-k}^5-X_k \quad (III)$$

so as to meet the relations of the equations (IV) and (V)

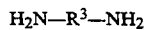

(IV)

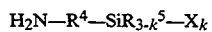

(V)

wherein $R^1$ is a tetravalent organic group; $R^2$ is independently an alkyl group having 1 to 6 carbon atoms, a phenyl group or an alkyl-substituted phenyl group having 7 to 12 carbon atoms; $R^3$ is an organic group having at least 2 carbon atoms or a polysiloxane group; $R^4$ is

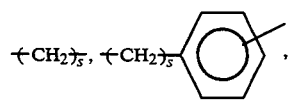

wherein s is an integer of 1 to 4; $R^5$ is independently an alkyl group having 1 to 6 carbon atoms, a phenyl group or an alkyl-substituted phenyl group having 7 to 12 carbon atoms; X is a hydrolyzable alkoxy group; and Z is

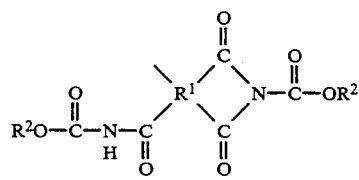

or

-continued

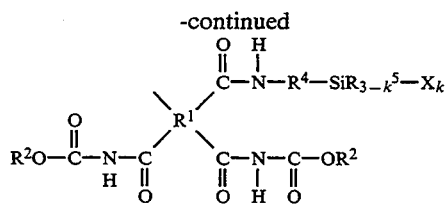

wherein k is a value of $1 \leq k \leq 3$ and $n \geq 0$.

2. A photosensitive resin composition which comprises (1) a silicon-containing polyamic acid derivative represented by the formula (VI)

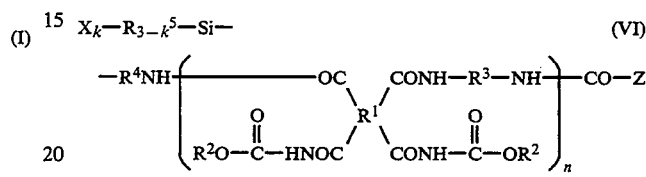

(VI)

and having a logarithmic viscosity number of 0.1 to 5.0 dl/g at 30° C. in N-methyl-2-pyrrolidone, said silicon-containing polyamic acid derivative being obtained by reacting A mol of a tetracarboxylic acid derivative represented by the formula (I)

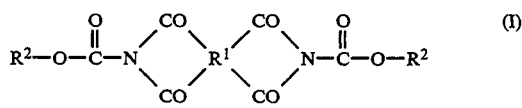

(I)

B mol of a diamine represented by the formula (II)

$$H_2N-R^3-NH_2 \quad (II)$$

and C mol of an aminosilicon compound represented by the formula (III)

(III)

so as to meet the relations of the equations (IV) and (V)

(IV)

(V)

wherein $R^1$ is a tetravalent organic group; $R^2$ is independently an alkyl group having 1 to 6 carbon atoms, a phenyl group or an alkyl-substituted phenyl group having 7 to 12 carbon atoms; $R^3$ is an organic group having at least 2 carbon atoms or a polysiloxane group; $R^4$ is

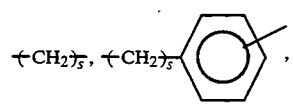

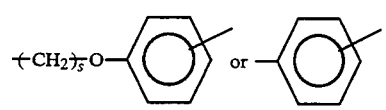

wherein s is an integer of 1 to 4; $R^5$ is independently an alkyl group having 1 to 6 carbon atoms, a phenyl group or an alkyl-substituted phenyl group having 7 to 12 carbon atoms; X is a hydrolyzable alkoxy group; and Z is
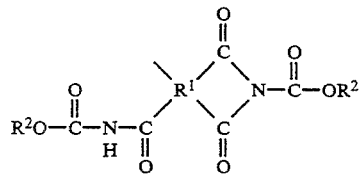
or
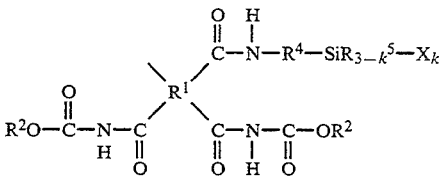
wherein k is a value of $1 \leq k \leq 3$ $n \geq 0$ and (2) a compound capable of generating an acid by light irradiation.
* * * * *